United States Patent
Madaiah

(10) Patent No.: US 11,129,299 B2
(45) Date of Patent: Sep. 21, 2021

(54) HEAT SINK

(75) Inventor: Vinod Kumar Madaiah, Bangalore (IN)

(73) Assignee: TEJAS NETWORK LIMITED, Bangalore (IN)

( * ) Notice: Subject to any disclaimer, the term of this patent is extended or adjusted under 35 U.S.C. 154(b) by 652 days.

(21) Appl. No.: 14/008,076

(22) PCT Filed: Mar. 28, 2012

(86) PCT No.: PCT/IN2012/000207
§ 371 (c)(1),
(2), (4) Date: Sep. 27, 2013

(87) PCT Pub. No.: WO2012/131713
PCT Pub. Date: Oct. 4, 2012

(65) Prior Publication Data
US 2014/0014310 A1     Jan. 16, 2014

(30) Foreign Application Priority Data
Mar. 31, 2011   (IN) .......................... 1101/CHE/2011

(51) Int. Cl.
*H05K 7/20* (2006.01)
*H01L 23/367* (2006.01)
*H01L 23/467* (2006.01)

(52) U.S. Cl.
CPC ......... *H05K 7/2039* (2013.01); *H01L 23/367* (2013.01); *H01L 23/467* (2013.01); *H01L 2924/0002* (2013.01)

(58) Field of Classification Search
CPC ........ F28F 13/02; F28F 13/08; H05K 7/2039; H01L 23/367; H01L 23/467; H01L 2924/0002; H01L 2924/00
USPC ................. 165/80.3; 361/703, 704, 709, 710
See application file for complete search history.

(56) References Cited

U.S. PATENT DOCUMENTS

| | | | | |
|---|---|---|---|---|
| 4,682,651 A * | 7/1987 | Gabuzda | ............. | H01L 23/3672 165/185 |
| 6,343,016 B1 * | 1/2002 | Lin | ..................... | H01L 23/3672 165/185 |
| 6,418,020 B1 * | 7/2002 | Lin | ........................ | H01L 23/367 165/80.3 |
| 6,543,522 B1 * | 4/2003 | Hegde | ....................... | F28F 3/02 165/185 |
| 6,847,525 B1 * | 1/2005 | Smith | ...................... | F28F 3/02 165/80.3 |
| 6,937,473 B2 * | 8/2005 | Cheng | ...................... | F28F 3/02 165/185 |
| 7,079,390 B2 * | 7/2006 | Barr et al. | .................... | 361/690 |
| 7,408,777 B2 * | 8/2008 | Jeong | ................. | H05K 7/20963 165/104.33 |
| 7,929,293 B2 * | 4/2011 | Cao | ....................... | H01L 23/467 165/185 |

(Continued)

*Primary Examiner* — Tho V Duong
*Assistant Examiner* — Raheena R Malik
(74) *Attorney, Agent, or Firm* — Brundidge & Stanger, P.C.

(57) ABSTRACT

The invention relates to a improved heat sink. In one embodiment this is accomplished by a base member and a heat radiating portion, wherein heat radiating portion includes a plurality of fins, wherein the distance between rows of the plurality of fins (fluid guide) are arranged such that they don't obstruct the horizontal flow of fluid or change the characteristic of the fluid substantially.

6 Claims, 2 Drawing Sheets

(56) References Cited

U.S. PATENT DOCUMENTS

| | | | | |
|---|---|---|---|---|
| 2002/0174980 | A1* | 11/2002 | DiBene et al. | 165/185 |
| 2005/0034845 | A1* | 2/2005 | Barsun | F28F 3/02 |
| | | | | 165/104.33 |
| 2005/0045308 | A1* | 3/2005 | Wang | H01L 23/427 |
| | | | | 165/80.3 |
| 2005/0133197 | A1* | 6/2005 | Chang | H01L 23/467 |
| | | | | 165/80.3 |
| 2007/0215336 | A1* | 9/2007 | Hsu | 165/185 |
| 2008/0066888 | A1* | 3/2008 | Tong | H01L 23/3677 |
| | | | | 165/80.3 |
| 2009/0021913 | A1* | 1/2009 | Kuan | H01L 23/427 |
| | | | | 361/697 |
| 2009/0050293 | A1* | 2/2009 | Kuo | H01L 23/367 |
| | | | | 165/80.3 |
| 2009/0052138 | A1* | 2/2009 | Kuo | H01L 23/367 |
| | | | | 361/703 |
| 2009/0095452 | A1* | 4/2009 | Kuo | 165/144 |
| 2009/0145581 | A1* | 6/2009 | Hoffman | F28F 1/40 |
| | | | | 165/80.3 |
| 2009/0165996 | A1* | 7/2009 | Lynch | 165/80.3 |
| 2009/0180913 | A1* | 7/2009 | Kimberlin et al. | 418/261 |
| 2009/0321924 | A1* | 12/2009 | Funakoshi | H01L 23/4735 |
| | | | | 257/722 |
| 2010/0108292 | A1* | 5/2010 | Bhunia | H01L 23/467 |
| | | | | 165/80.3 |
| 2010/0258270 | A1* | 10/2010 | Arik | H01L 23/467 |
| | | | | 165/80.3 |
| 2011/0232885 | A1* | 9/2011 | Kaslusky | H01L 23/467 |
| | | | | 165/177 |
| 2013/0128461 | A1* | 5/2013 | Nagasawa | F28F 3/02 |
| | | | | 361/704 |

\* cited by examiner

— PRIOR ART —

HEAT SINK

FIELD OF THE INVENTION

The present invention relates to a heat sink

BACKGROUND OF THE INVENTION

Developments in today's highly information-intensive society have led to remarkable improvements in performances of electronic devices. During operation of many contemporary electronic devices large amounts of heat are produced. Such heat must be quickly removed from the electronic device, to prevent the device from becoming unstable or being damaged.

Typically, a heat sink is attached to an outer surface of the device to facilitate removal of heat therefrom. A conventional heat dissipating assembly essentially comprises a heat sink, and a clamping bar. The heat sink has a base, and a plurality of fins extending upwardly therefrom. The clamping bar includes a plurality of holes for passing through the fins and also has two or more locking posts extending outwardly from two corners of the bar.

In certain applications, the base area of a typical heat-sink (e.g., heat sink 100, as shown in FIG. 1) is significantly higher than the area of heat-source. For example BGA packing for ASICs used in telecommunications network element. These heat sinks are designed for specific thermal exchange requirements with the heat source. Further, they are optimal only when heat-source area is same in shape and value. The number of fins available over the BGA area is few and the existing architecture of heat sink is not optimal for heat exchange when the BGA area is less. Heat has to travel to farther fins for dissipation. Further the fluid flowing over the fins away from the BGA area is not able to exchange maximum heat from the fins as the difference between the temperature of the fluid and the fins at the edge of the heat-sink is not as high as when compared with the fins just above the BGA area.

Thus therefore there is a need for an improved heat sink which overcomes the above problems and limitation.

SUMMARY OF THE INVENTION

An aspect of the present invention is to address at least the above-mentioned problems and/or disadvantages and to provide at least the advantages described below.

Accordingly, an aspect of the present invention is to provide a heat sink, comprising a base member and a heat radiating portion, wherein heat radiating portion includes a plurality of fins, wherein the plurality of fins are arranged such that the distance between rows of the fins (fluid guide) allows the horizontal flow of fluid or without changing the characteristic of the fluid substantially.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings in which.

Persons skilled in the art will appreciate that elements in the figures are illustrated for simplicity and clarity and may have not been drawn to scale. For example, the dimensions of some of the elements in the figure may be exaggerated relative to other elements to help to improve understanding of various exemplary embodiments of the present disclosure.

Throughout the drawings, it should be noted that like reference numbers are used to depict the same or similar elements, features, and structures.

DETAIL DESCRIPTION OF THE INVENTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Figure 1:
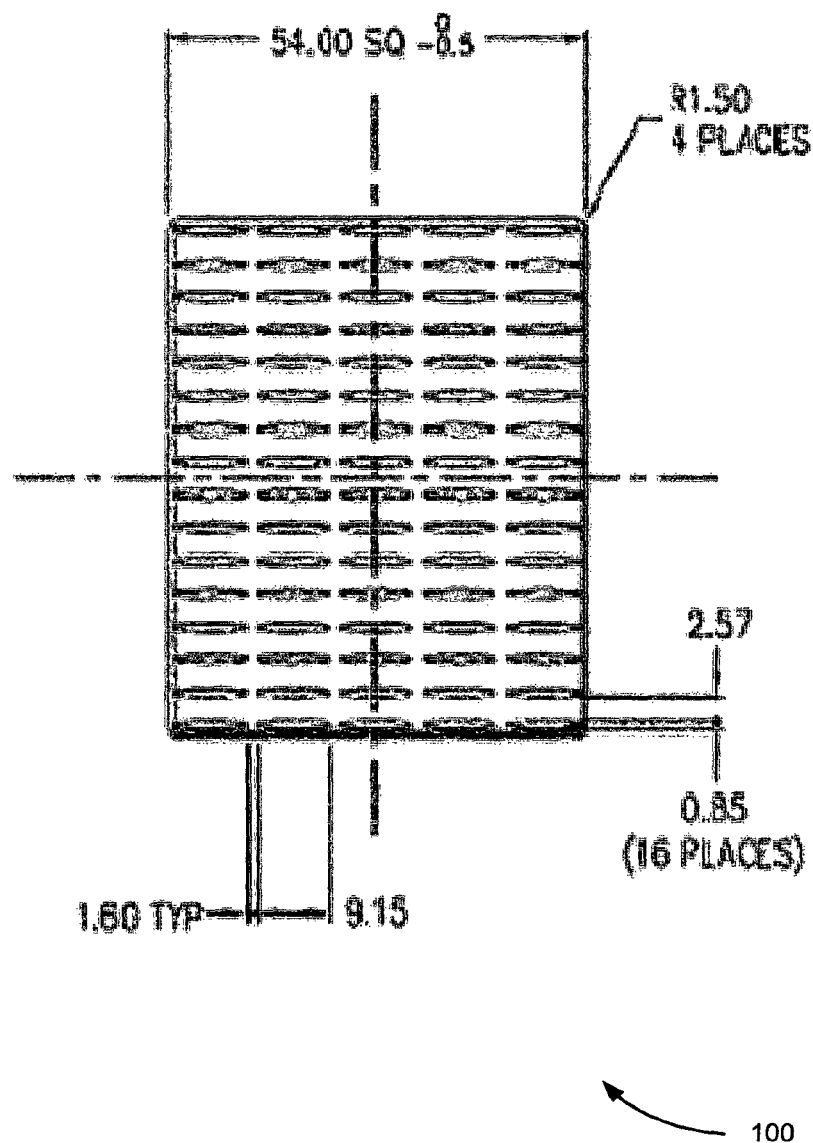
FIG. 1 shows a top view of a typical heat sink.
Figure 2:
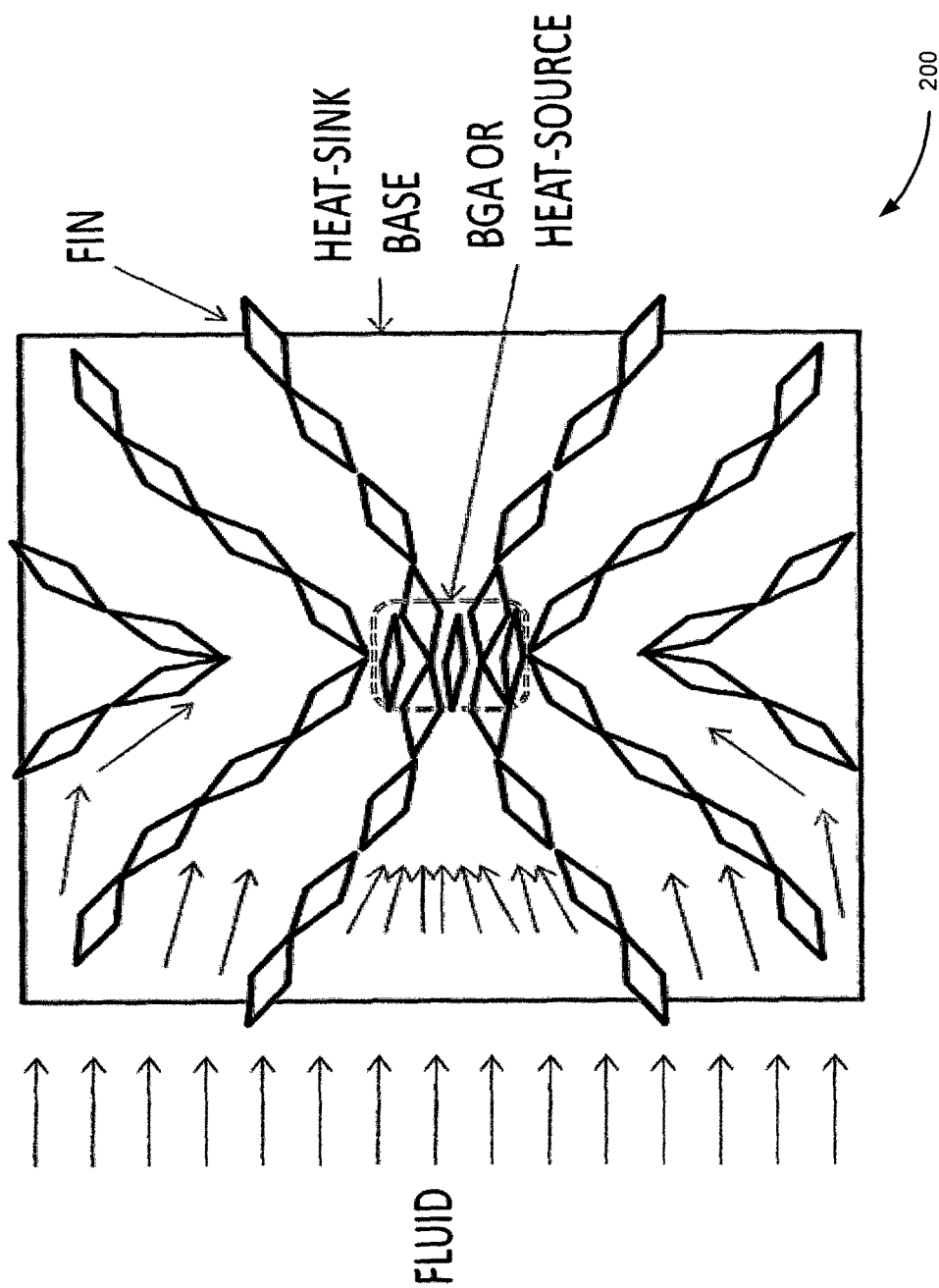
FIG. 2 shows an improved heat sink in accordance with one embodiment of the present invention.

FIGS. 1 through 2, discussed below, and the various embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly stated otherwise. A set is defined as a non-empty set including at least one element.

Referring to drawings and in particular to FIG. 2, therein is shown a pictorial top view of an exemplary embodiment of an improved heat sink (e.g., heat sink 100) that may be used to provide thermal management of various electronic devices. In this illustrative embodiment, the heat sink may be used to provide thermal management of an electronic device, which may be virtually any type of electronic device that can benefit from thermal management. Examples include microprocessors, graphics processors, combined microprocessor/graphics processors, application specific integrated circuits, memory devices or the like, and such devices may be single core, multi-core and/or stacked in groups of multiple devices. Other examples include optical devices, such as lasers.

The heat sink includes a base member that is designed to seat on the circuit device or any electronic device. The base member advantageously provides a surface area that at least approximates the surface area of the circuit device so that a low thermal resistance pathway from the circuit device is established. The base member is advantageously constructed from a material(s) exhibiting desirable thermal conductivity. Examples include copper, nickel, aluminum, steel, combinations of these or the like. Somewhat more exotic materials, such as diamond or sapphire, could also be used for extreme thermal environments. Thermal grease (not shown) may be applied to the interface between the base member and the circuit device in order to further enhance conductive heat transfer between the two components.

In an example embodiment a heat sink, includes a base member and a heat radiating portion, wherein heat radiating portion includes a plurality of fins. The distances between rows of the plurality of fins (fluid guide) are arranged such that the horizontal flow of fluid is unobstructed or not change the characteristic of the fluid substantially. Further the distance between the fins are within the same row are arranged such that the fluids converge towards at the centre of the heat radiating portion, so that the intensity of the fluid is larger at the center without leaking to adjacent or neighboring fluid guide.

The fluids may be at least one of the air, water, refrigerants, oil or of any type of fluids which is used for heat dissipation.

The plurality of fins are of a shape which prevents substantial leakage of fluid from one fluid guide to another fluid guide, and wherein the shape of fin is such that it increases heat dissipation or transfer with the fluid. The shape of the fins may by of any structure not limited to as shown in the FIG. 2.

The plurality of fins are arranged such that the rate of flow of fluid within the fluid guide to prevent substantial leakage, and wherein the pressure of flow of fluid within the fluid guide is maintained in such a way that substantial leakage of fluid is prevented from one fluid guide to another. Also, the distance between the rows of fin is maintained such that leakage is prevented into neighboring fluid guide. The fins are arranged such a way it increase the concentration where BGA is in contact with the heat-sink base. The number of fins is dependent on the heat generated by the BGA. There can be just one fin per row.

Advantages:

The present improved heat sink has the following advantages over existing heat sinks.
1. Increasing the density of the fins near to the heat-source
2. Guiding fluid such that more of them flow over the fins close to the heat-source.
3. Increasing the surface area on the heat sink near to the heat-source for heat exchange FIGS. 1-2 are merely representational and are not drawn to scale. Certain portions thereof may be exaggerated, while others may be minimized. FIGS. 1-2 illustrate various embodiments of the invention that can be understood and appropriately carried out by those of ordinary skill in the art.

In the foregoing detailed description of embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus, the following claims are hereby incorporated into the detailed description of embodiments of the invention, with each claim standing on its own as a separate embodiment.

It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively.

I claim:

1. A heat sink, comprising:
   a base member situated adjacent to a heat source, wherein the base member has a surface area at least approximates the surface area of the heat source such that the surface area of the base member is equal to or larger than the surface area of the heat source; and
   a heat radiating portion,
   wherein the heat radiating portion includes a plurality of fins,
   wherein the plurality of fins are arranged to form a plurality of fluid guides, wherein each fluid guide comprises at least one of the plurality of fins and the distance between adjacent fluid guides is arranged such that fluids converge towards the center of the heat radiating portion, and intensity of the fluid is greater at the center without leaking into the adjacent fluid guide or between fins in the same row,
   wherein at least one fluid guide formed by the plurality of fins longitudinally traverses across a portion of the base member situated adjacent to the heat source with increasing concentration of fins where the base member is in contact with the heat source, wherein the increasing concentration of fins is provided by a plurality of fluid guides,
   and
   wherein each of the plurality of fins is of a shape which prevents substantial leakage of fluid from one fluid guide over to another fluid guide and wherein shape of the fin is substantially a rhomboid.

2. The heat sink of claim 1, wherein the plurality of fins are arranged such that the substantial leakage of fluid is prevented from one fluid guide over to another.

3. The heat sink of claim 1, wherein concentration of the fins increase where a Ball Grid Array (BGA) or heat source is in contact with the heat-sink base.

4. The heat sink of claim 3, wherein the number of fins is dependent on the heat generated by the Ball Grid Array (BGA) or the heat source.

5. The heat sink of claim 1, wherein the base member and the heat radiation portion are made up of any of: aluminum, copper, nickel, steel, diamond, sapphire or a combination thereof.

6. The heat sink of claim 1, wherein the fluid is air, water, refrigerants, oil, or a combination thereof.

* * * * *